(12) United States Patent
Nejime et al.

(10) Patent No.: US 8,890,001 B2
(45) Date of Patent: Nov. 18, 2014

(54) WIRING BOARD AND MOUNTING STRUCTURE USING THE SAME

(71) Applicant: Kyocera SLC Technologies Corporation, Yasu (JP)

(72) Inventors: Takayuki Nejime, Ritto (JP); Masaaki Harazono, Kirishima (JP); Yoshihiro Hosoi, Kirishima (JP)

(73) Assignee: Kyocera SLC Technologies Corporation, Yasu-Shi, Shiga (JP)

(*) Notice: Subject to any disclaimer, the term of this patent is extended or adjusted under 35 U.S.C. 154(b) by 103 days.

(21) Appl. No.: 13/750,801

(22) Filed: Jan. 25, 2013

(65) Prior Publication Data
US 2013/0192882 A1 Aug. 1, 2013

(30) Foreign Application Priority Data

Jan. 27, 2012 (JP) ................................. 2012-014851

(51) Int. Cl.
*H05K 1/11* (2006.01)
*H05K 1/03* (2006.01)
*H05K 3/00* (2006.01)

(52) U.S. Cl.
CPC .......... *H05K 1/038* (2013.01); *H05K 2203/025* (2013.01); *H05K 3/0044* (2013.01); *H05K 2203/1572* (2013.01); *H05K 1/036* (2013.01)
USPC ............................ 174/262; 174/255; 174/260

(58) Field of Classification Search
CPC ..... H05K 1/036; H05K 1/038; H05K 1/0366; H05K 1/0373; H05K 1/112; H05K 1/115; H05K 3/4038; H05K 3/429; H05K 3/3447; H05K 2201/095; H05K 2201/09536; H05K 2201/09527; H05K 2201/09563

USPC .................. 174/255, 256, 260, 262, 264–266
See application file for complete search history.

(56) References Cited

U.S. PATENT DOCUMENTS 4,307,935 A * 12/1981 Monnier .......................... 385/88
7,521,799 B2    4/2009 Hayashi et al.
(Continued)

FOREIGN PATENT DOCUMENTS

JP    H07-336002 A    12/1995
JP    2000-022302 A    1/2000
(Continued)

OTHER PUBLICATIONS

Notification concerning Submission of Information by a Third Party dated Jul. 2, 2014 issued in corresponding Japanese application No. 2012-014851.

(Continued)

*Primary Examiner* — Hoa C Nguyen
(74) *Attorney, Agent, or Firm* — Procopio, Cory, Hargreaves & Savitch LLP

(57) ABSTRACT

A wiring board of the present invention includes a substrate including a woven fabric formed of a plurality of glass fibers and a resin covering the woven fabric; a plurality of through holes T penetrating through the substrate in a thickness direction thereof; and a plurality of through hole conductors adhered to inner walls of the through holes T respectively. The through holes T include a first through hole and a second through hole, and, in the woven fabric, the number of the glass fibers through which the first through hole penetrates is larger than the number of the glass fibers through which the second through hole penetrates. In the first and second through holes, portions thereof having narrowest widths are surrounded by the woven fabric, and the narrow width portion of the first through hole is smaller than the narrow width portion of the second through hole.

8 Claims, 6 Drawing Sheets

(56) References Cited

U.S. PATENT DOCUMENTS

| | | |
|---|---|---|
| 7,791,204 B2 | 9/2010 | Hayashi et al. |
| 8,018,066 B2 | 9/2011 | Hayashi et al. |
| 2006/0244128 A1 | 11/2006 | Hayashi et al. |
| 2009/0174065 A1 | 7/2009 | Hayashi et al. |
| 2009/0229868 A1* | 9/2009 | Tsukada et al. ............... 174/258 |
| 2010/0187679 A1 | 7/2010 | Hayashi et al. |
| 2010/0264552 A1* | 10/2010 | Nakasato et al. ............. 257/778 |
| 2010/0307557 A1* | 12/2010 | Yamazaki et al. ............ 136/244 |
| 2011/0024170 A1* | 2/2011 | Nagasawa ..................... 174/258 |
| 2011/0061231 A1* | 3/2011 | Hwang et al. .................. 29/830 |
| 2011/0269273 A1 | 11/2011 | Hayashi et al. |
| 2012/0133045 A1 | 5/2012 | Hayashi et al. |
| 2012/0312591 A1* | 12/2012 | Hwang et al. ................. 174/266 |
| 2013/0147053 A1* | 6/2013 | Park et al. ..................... 257/774 |

FOREIGN PATENT DOCUMENTS

| | | |
|---|---|---|
| JP | 2002-141628 A | 5/2002 |
| JP | 2002-208763 A | 7/2002 |
| JP | 2003-209359 A | 7/2003 |
| JP | 2004-146711 A | 5/2004 |
| JP | 2006-324642 A | 11/2006 |
| JP | 2009-283958 A | 12/2009 |
| JP | 4534062 B2 | 6/2010 |
| JP | 2011-210794 A | 10/2011 |

OTHER PUBLICATIONS

Kimura et al. "The Researches in Thinness and Functions of Glass Fabrics." Japan Institute of Electronics Packaging (JIEP) 2007 vol. 10, No. 2, pp. 120-125.

Mandarame et al. "Laser Drilling Processability of Glass Epoxi Laminates by C02 Laser." MES2001 (the 11th Microelectronics Symposium) Oct. 2011, pp. 111-114.

* cited by examiner

US 8,890,001 B2

WIRING BOARD AND MOUNTING STRUCTURE USING THE SAME

BACKGROUND OF THE INVENTION (1) Field of the Invention

The present invention relates to a wiring board and a mounting structure using the same used in electronic devices such as various types of audio visual devices, household electric appliances, communication devices, computer devices, and peripheral devices thereof.

(2) Description of the Related Art

Conventionally, a structure in which an electronic component is mounted on a wiring board is used as a mounting structure in an electronic device.

Regarding the wiring board, Japanese Unexamined Patent Publication No. 2006-324642 discloses a wiring board in which a through hole is formed by drilling in a core substrate having glass cloth impregnated with an insulating resin, and a through hole via (through hole conductor) made of Cu or the like is formed on a side wall of the through hole by plating.

Further, Japanese Unexamined Patent Publication No. 2003-209359 discloses a wiring board in which a through hole is formed by laser processing in a core substrate having epoxy resin or the like reinforced by glass cloth, and conductive paste is filled in the through hole.

Incidentally, separation may be caused between glass cloth and a resin in a core substrate. In such a case, when a voltage is applied to a through hole conductor, part of the through hole conductor which is ionized by the voltage infiltrates into the separated portion (ion migration), and adjacent through hole conductors may make a short circuit. Accordingly, the electrical reliability of the wiring board tends to be decreased.

SUMMARY OF THE INVENTION

The principal object of the present invention is to provide a wiring board and a mounting structure using the same which responds to a demand for improving electrical reliability.

A wiring board of the present invention includes a substrate including a woven fabric formed of a plurality of glass fibers and a resin covering the woven fabric; a plurality of through holes penetrating through the substrate in a thickness direction thereof; and a plurality of through hole conductors adhered to inner walls of the through holes respectively, in which, the through holes comprise a first through hole and a second through hole; in the woven fabric, the number of the glass fibers through which the first through hole penetrates is larger than the number of the glass fibers through which the second through hole penetrates; in the first through hole and the second through hole, narrow width portions thereof having narrowest widths, respectively, are surrounded by the woven fabric; and the narrowest portion of the first through hole is smaller than the narrowest portion of the second through hole.

According to the wiring board of the present invention, by reducing a minimum diameter of a region surrounded by the woven fabric in the first through hole penetrating through a larger number of glass fibers, ion migration is reduced, and the electrical reliability of the wiring board can be improved.

DESCRIPTION OF THE PREFERRED EMBODIMENTS

Hereinafter, a wiring board and a mounting structure according to one embodiment of the present invention will be described in detail with reference to the drawings.

Figure 1:
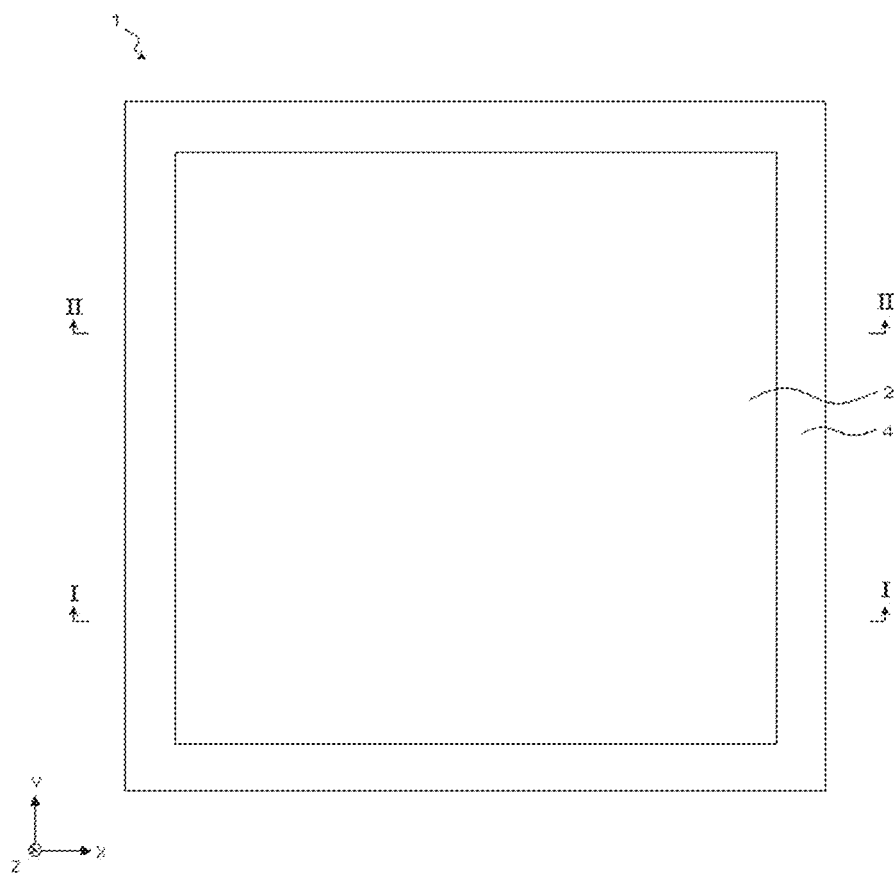
FIG. 1 is a plan view of a mounting structure according to an embodiment of the present invention.
Figure 2:
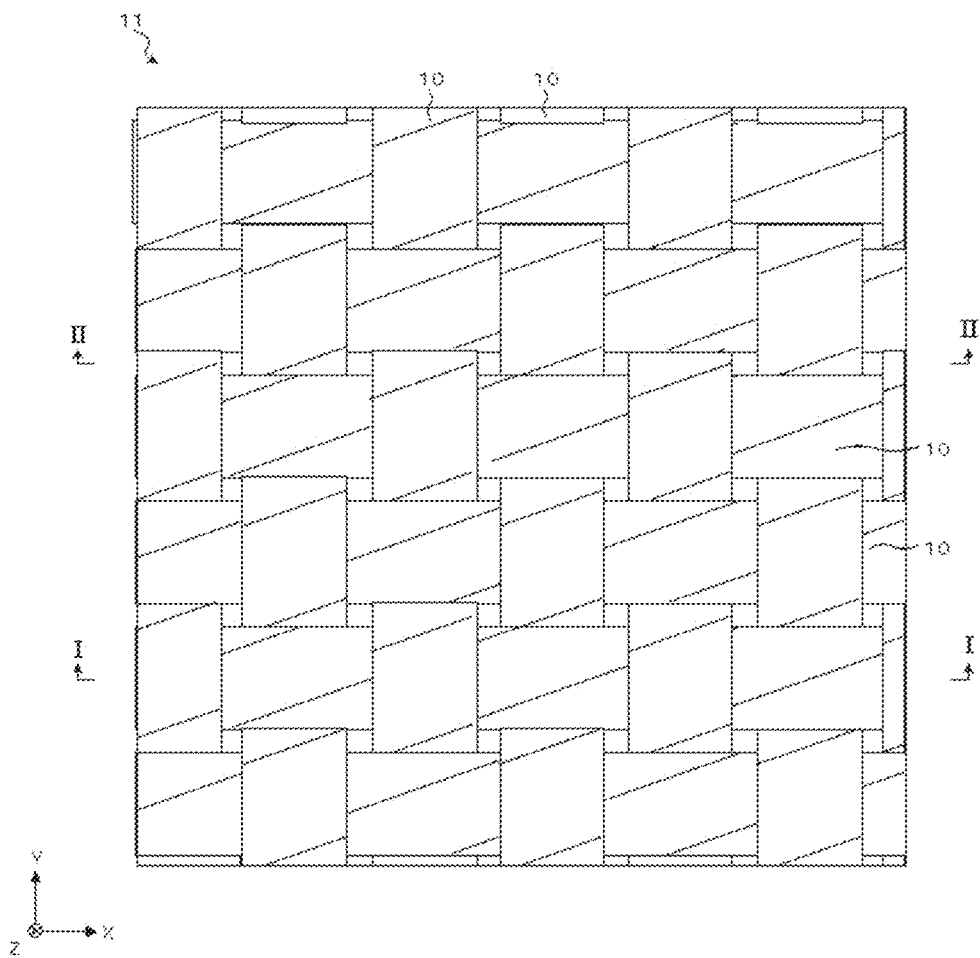
FIG. 2 is a plan view of a woven fabric included in the mounting structure illustrated in FIG. 1.
Figure 3A:
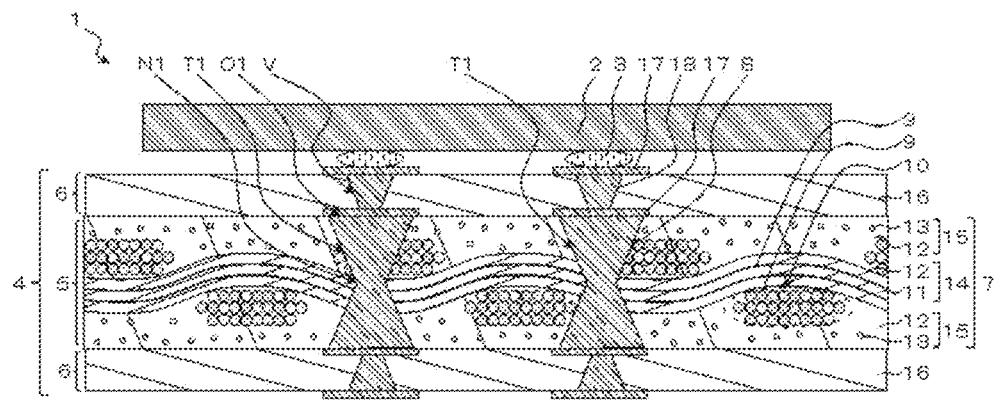
FIG. 3A is a cross sectional view taken along line I-I in a thickness direction of the mounting structure illustrated in FIG. 1.
Figure 3A:
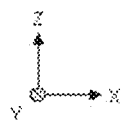
Figure 3B:
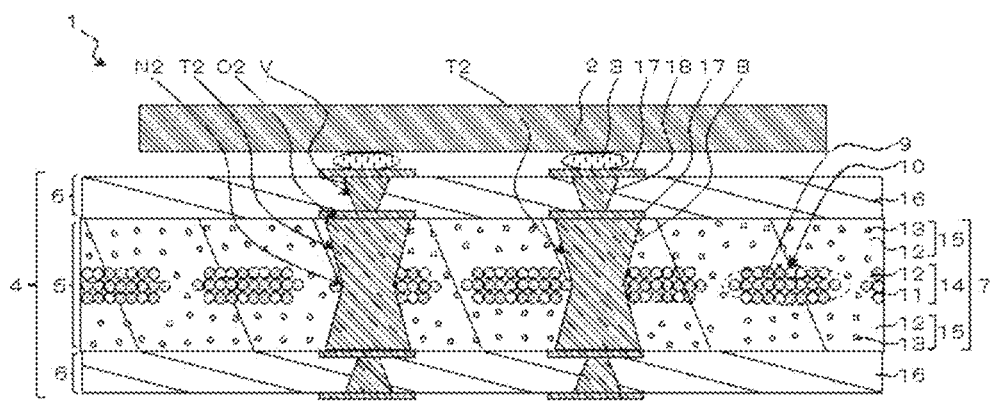
FIG. 3B is a cross sectional view taken along line II-II in the thickness direction of the mounting structure illustrated in FIG. 1.
Figure 3B:
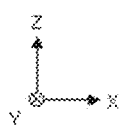

A mounting structure 1 illustrated in FIGS. 1 to 3 is used, for example, in electronic devices such as various types of audio visual devices, household electric appliances, communication devices, computer devices, or peripheral devices thereof. The mounting structure 1 includes an electronic component 2, and a plate-shaped wiring board 4 on which the electronic component 2 is mounted by flip chip bonding through a bump 3.

The electronic component 2 is a semiconductor device such as an IC or an LSI, and is made of a semiconductor material such as silicon, germanium, gallium arsenide, gallium arsenide phosphide, gallium nitride, or silicon carbide. The thickness of the electronic component 2 is set, for example, to 0.1 mm to 1 mm.

The bump 3 is made of a conductive material such as solder containing lead, tin, silver, gold, copper, zinc, bismuth, indium, or aluminum.

The wiring board 4 includes a plate-shaped core substrate 5 and a pair of wiring layers 6 formed on upper and lower sides of the core substrate 5.

The core substrate 5 electrically connects the pair of wiring layers 6 to each other while maintaining the strength of the wiring board 4. The core substrate 5 includes a plate-shaped substrate 7, a plurality of through holes T formed to penetrate through the substrate 7 in a thickness direction thereof, and a through hole conductor 8 filled in each of the through holes T.

The substrate 7 is to enhance the rigidity of the core substrate 5, and, as illustrated in FIG. 3, includes a woven fabric 11 formed by weaving, lengthwise and widthwise (X-direction and Y-direction), fiber bundles 10 formed of a plurality of glass fibers 9, and a resin 12 that covers the woven fabric 11. In the resin 12, inorganic insulating particles 13 are dispersed.

In this substrate 7, a layer that is formed of the woven fabric 11 and a resin 12 (first resin) arranged among the glass fibers 9 of the woven fabric 11 is a fiber layer 14. Further, a layer, which is arranged among each fiber layers 14, does not include glass fibers, and formed of the resin 12 (second resin) and the inorganic insulating particles 13, is a resin layer 15. A border between the fiber layer 14 and the resin layer 15 is formed by an interface between the glass fiber 9 of the fiber layer 14 and the resin 12 of the resin layer 15. The fiber layer 14 may include the inorganic insulating particles 13 among the glass fibers 9.

In the embodiment illustrated in FIG. 3, the substrate 7 includes one layer of the woven fabric 11 that is covered by the resin 12. Accordingly, the substrate 7 includes one fiber layer 14 and the pair of resin layers 15 arranged on upper and lower sides of the fiber layer 14.

The thickness of the substrate 7 is set, for example, to 0.03 mm to 0.4 mm. In the substrate 7, the coefficient of thermal expansion in a planar direction thereof is set, for example, to 4 ppm/° C. to 15 ppm/° C., the coefficient of thermal expansion in a thickness direction thereof is set, for example, to 11 ppm/° C. to 30 ppm/° C., the coefficient of thermal expansion in the thickness direction is set, for example, to 2 to 2.8 times the coefficient of thermal expansion in the planar direction, and Young's modulus thereof is set to 20 GPa to 30 GPa.

The coefficient of thermal expansion of the substrate 7 is measured according to the measurement method in accordance with JISK7197-1991 using a commercially available TMA apparatus. The Young's modulus of the substrate 7 is measured using Nano Indentor XP/DCM manufactured by MTS Systems Co.

The woven fabric 11 included in the substrate 7 enhances the rigidity of the substrate 7 and reduces the coefficient of thermal expansion thereof in the planar direction. The fiber bundle 10 forming the woven fabric 11 is a bundle of a plurality of glass fibers 9 in which the fibers are parallel to one another, has a thin elongated shape, and has a cross section perpendicular to a longer direction thereof in an ellipsoidal shape. Such fiber bundles 10 are woven lengthwise and widthwise, and therefore the woven fabric 11 includes a high-density region (FIG. 3A) including a larger number of the glass fibers 9, and a low-density region (FIG. 3B) including a smaller number of the glass fibers 9 in a thickness direction.

In the fiber bundle 10, the width thereof is set larger than the thickness thereof. The fiber bundle 10 has a width thereof set, for example, to 300 μm to 500 μm and a thickness thereof set, for example, to 20 μm to 100 μm. One fiber bundle 10 includes the number of glass fibers 9 between 50 and 200, for example.

Examples of the glass fiber 9 constituting the fiber bundle 10 include a fiber made of glass such as T-glass, S-glass, or E-glass. The diameter of a cross section of the glass fiber 9 in a direction perpendicular to a longer direction thereof is set, for example, to 4 μm to 9 μm, the coefficients of thermal expansion thereof in the longer direction and in a width direction thereof are set to 2.5 ppm/° C. to 6 ppm/° C., and a Young's modulus thereof is set to 70 GPa to 85 GPa.

Examples of the resin 12 that covers the woven fabric 11 include epoxy resin, bismaleimide triazine resin, cyanate resin, poly(p-phenylenebenzobisoxazole) resin, wholly aromatic polyamide resin, polyimide resin, aromatic liquid crystal polyester resin, polyether ether ketone resin, polyether ketone resin, or the like. The resin 12 has coefficients of thermal expansion in a planar direction and a thickness direction thereof are set, for example, to 20 ppm/° C. to 50 ppm/° C., and has a Young's modulus set, for example, to 3 GPa to 10 GPa.

The inorganic insulating particles 13 are to reduce the coefficient of thermal expansion of the substrate 7 and enhance the rigidity of the substrate 7, and an inorganic insulating material such as aluminum hydroxide, magnesium hydroxide, or silicon oxide is included as the inorganic insulating particles 13. Among these inorganic insulating materials, it is preferable that the material contains silicon oxide which has characteristics such a coefficient of thermal expansion and a Young's modulus close to those of the glass fiber. As a result, the coefficient of thermal expansion and the Young's modulus of the resin layer 15 are made closer to those of the fiber layer 14. When the inorganic insulating particles 13 contain silicon oxide, it is preferable that the inorganic insulating particles 13 contain 65 wt % to 100 wt % of silicon oxide. The inorganic insulating particles 13 may contain, other than silicon oxide, aluminum oxide, magnesium oxide, calcium oxide, aluminum nitride, aluminum hydroxide, calcium carbonate, or the like.

The inorganic insulating particles 13 are formed, for example, in a spherical shape, the particle diameter thereof is set, for example, to 0.5 μm to 5.0 μm, the coefficients of thermal expansion thereof in each direction are set, for example, to 2.7 ppm/° C. to 6 ppm/° C., and the Young's modulus is set, for example, to 70 GPa to 85 GPa. Here, particles obtained by finely cutting a glass fiber may be also used as the inorganic insulating particles 13.

It is preferable that the content of the inorganic insulating particles 13 in the resin layer 15 be set to 40% by volume to 75% by volume. By setting the content of the inorganic insulating particles 13 to 40% or more by volume, the coefficient of thermal expansion and the Young's modulus of the resin layer 15 can be made closer to those of the fiber layer 14. Further, by setting the content of the inorganic insulating particles 13 to 75% or less by volume, an adhesion strength between the inorganic insulating particles 13 and the resin 12 located in an inner wall of a through hole T can be enhanced. As a result, an occurrence of separation between the inorganic insulating particles 13 and the resin layer 12 can be reduced, and also an occurrence of separation between the through hole conductor 8 and the resin layer 15 can be reduced.

The particle diameter of the inorganic insulating particles 13 is measured by observing a cross section of the substrate 7 with a field-emission electron microscope, measuring maximum diameters of individual particles, and calculating an average value thereof. The content (% by volume) of the inorganic insulating particles 13 in the resin layer 15 can be measured by observing the cross section of the resin layer 15 with a field-emission electron microscope, measuring an area ratio (% by area) occupied by the inorganic insulating particles 13 with respect to the resin layer 15, and calculating the average value, so that the average value may be regarded as the content (% by volume).

In addition, the through hole T has openings O in two principal surfaces of the substrate 7, and narrows down from the two principal surfaces of the substrate 7 toward a center of the substrate 7. A narrow width portion N which is the narrowest in a through hole T is surrounded by the woven fabric 11.

Among a plurality of through holes T, the one that penetrates through the high-density region of the woven fabric 11 is named as a first through hole T1, and the one that penetrates through the low-density region of the woven fabric 11 is named as a second through hole T2. In this case, in the woven fabric 11, the number of glass fibers 9 through which the first through hole T1 penetrates is larger than the number of glass fibers 9 through which the second through hole T2 penetrates. In the first through hole T1 and the second through hole T2, the width of the narrow width portion N is set smaller than the width of the fiber bundle 10, and the first through hole T1 or the second through hole T2 penetrates through the high-density region or the low-density region.

The narrow width portion N of the first through hole T1 is named as a first narrow width portion N1, and the narrow width portion N of the second through hole T2 is named as a second narrow width portion N2. The opening O in each of the two principal surfaces of the first through hole T1 is named as a first opening O1, and the opening O in each of the two principal surfaces of the second through hole T2 is named as a second opening O2.

The width of the first opening O1 is set, for example, to 30 μm to 105 μm. Further, a minimum width in a region of the first through hole T1 surrounded by the woven fabric 11, i.e., the width of the first narrow width portion N1, is set, for example, to 15 μm to 60 μm.

The width of the second opening O2 is set, for example, to 30 μm to 105 μm. Further, a minimum width in a region of the second through hole T2 surrounded by the woven fabric 11, i.e., the width of the second narrow width portion N2, is set, for example, to 20 μm to 95 μm.

In one principal surface of the substrate 7, the width of the first opening O1 is set, for example, to 0.9 to 1.1 times the width of the second opening O2. Preferably, the width of the first opening O1 is identical with the width of the second opening O2. The minimum width (first narrow width portion N1) of the region of the first through hole T1 surrounded by the woven fabric 11 is smaller than the minimum width (second narrow width portion N2) of the region of the second through hole T2 surrounded by the woven fabric 11. The through hole T is formed in a tapered shape in a cross section along a thickness direction of the substrate 7 from each of the openings O formed the two principal surfaces of the substrate 7 toward the narrow width portion N. The degree of taper (taper rate) of the first through hole T1 is larger than the degree of taper of the second through hole T2 and is in a shape further narrowed down toward the front thereof. The width of the first narrow width portion N1 is set, for example, to 0.5 or larger and smaller than 0.9 times the width of the second narrow width portion N2.

The widths of the fiber bundle 10, the opening O, and the narrow width portion N, respectively, are measured in cross sections taken along a thickness direction of the substrate 7.

The through hole conductor 8 adhered to the inner wall of the through hole T is to electrically connect the upper and lower wiring layers 6 of the core substrate 5 to each other. Examples of materials for the through hole conductor 8 include conductive materials such as copper, aluminum, and nickel. It is preferable to use copper having high conductivity among these materials. The coefficients of thermal expansion of the through hole conductor 8 in a penetrating direction and a width direction are set, for example, to 16 ppm/° C. to 25 ppm/° C., and the Young's modulus thereof is set, for example, to 60 GPa to 210 GPa. The coefficient of thermal expansion of copper is about 18 ppm/° C. The coefficient of thermal expansion and the Young's modulus of the through hole conductor 8 are measured in the same manner as applied to the substrate 7.

The pair of wiring layers 6 is formed on two sides of the core substrate 5 as described above. Each of the wiring layers 6 is stacked on the substrate 7, and includes an insulating layer 16 in which a via hole V penetrating through in a thickness direction is formed, a conductive layer 17 formed on a surface of the substrate 7 or on a surface of the insulating layer 16, and a via conductor 18 formed inside the via hole V and electrically connected to the conductive layer 17.

The insulating layer 16 is made of a resin in which the inorganic insulating particles are dispersed, and functions not only as a support member for supporting the conductive layer 17 but also as an insulating member for preventing a short circuit between the conductive layers 17. The thickness of the insulating layer 16 is set, for example, to 5 μm to 40 μm, the coefficients of thermal expansion in a planar direction and a thickness direction are set, for example, to 15 ppm/° C. to 45 ppm/° C., and the Young's modulus is set, for example, to 5 GPa to 40 GPa. The coefficient of thermal expansion and the Young's modulus of the insulating layer 16 are measured in the same manner as applied to the substrate 7.

Examples of resins that form the insulating layer 16 include epoxy resin, bismaleimide triazine resin, cyanate resin, poly(p-phenylenebenzobisoxazole) resin, wholly aromatic polyamide resin, polyimide resin, aromatic liquid crystal polyester resin, polyether ether ketone resin, polyether ketone resin, or the like.

Examples of the inorganic insulation particles contained in the insulating layer 16 include the inorganic insulation particles 13 that are contained in the substrate 7 described above.

The conductive layer 17 functions, for example, as a ground wire, a power supply wire, or a signal wire. The conductive layer 17 is formed of a metallic material such as copper, silver, gold, aluminum, nickel, or chrome. It is preferable to use copper having high conductivity among these materials. The thickness of the conductive layer 17 is set, for example, to 3 μm to 20 μm, the coefficients of thermal expansion in a planar direction and a thickness direction are set, for example, to 5 ppm/° C. to 25 ppm/° C., and the Young's modulus is set, for example, to 50 GPa to 250 GPa.

The via conductor 18 is to connect the conductive layers 17 to each other which are separated from each other in a thickness direction. The via conductor 18 is formed in a tapered shape whose width becomes narrower toward the core substrate 5, and is formed of a conductive material such as copper, silver, gold, aluminum, nickel, or chrome. It is preferable to use copper having high conductivity among these materials.

Incidentally, since the coefficients of thermal expansion of the glass fiber 9 and the resin 12 are different, when heat is applied to the wiring board 4, a thermal stress is applied between the glass fiber 9 and the resin 12, and the glass fiber 9 and the resin 12 may be separated from each other. In such a case, when a voltage is applied to the through hole conductor 8, part of the through hole conductor 8 which is ionized by the voltage infiltrates into the separated portion and tends to move toward the adjacent through hole conductor 8 (ion migration).

As described above, by narrowing the minimum width (first narrow width portion N1) in the region of the first through hole T1 surrounded by the woven fabric 11 in the high-density region where the number of the glass fibers 9 is larger, it is possible to increase a distance between the adjacent through holes T in the woven fabric 11. As a result, an occurrence of a short circuit between the adjacent through hole conductors 8 caused by the ion migration can be reduced, and eventually it is possible to provide the wiring board 4 having the excellent electrical reliability. Further, by reducing an occurrence of the short circuit between the adjacent through hole conductors 8, the through hole conductors 8 are arranged closer so that the wiring board 4 with high-density wiring can be provided while the electrical reliability is secured.

In contrast, in the low-density region having the smaller number of glass fibers 9, by enlarging the minimum width (second narrow width portion N2) in the region of the second through hole T2 surrounded by the woven fabric 11, the width of the through hole 8 is enlarged, and therefore a plating solution easily infiltrates into the second through hole T2 when the through hole conductor 8 is formed. Accordingly, the through hole conductor 8 can be formed in the second through hole T2 in a higher yield, and the electrical reliability of the wiring board 4 can be increased.

By enlarging the minimum width of the second through hole T2 surrounded by the woven fabric 11, an electric resistance of the through hole conductor 8 can be reduced, and eventually the electrical reliability of the wiring board 4 can be increased.

The mounting structure 1 described above exerts a desired function by driving or controlling the electronic component 2 based on power or a signal supplied through the wiring board 4.

Next, a method of manufacturing the mounting structure 1 described above will be described with reference to FIGS. 4 and 5.

(Preparation of Substrate)

Figure 4A:
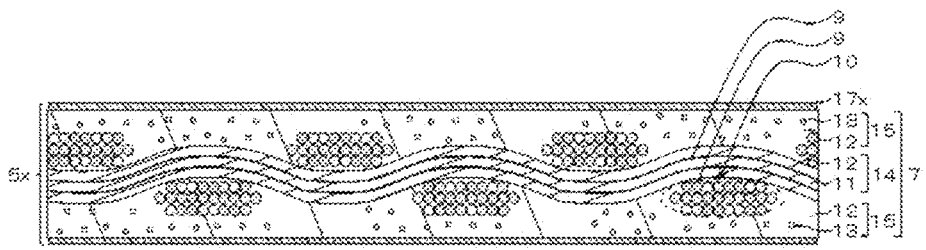
FIGS. 4A and 4B are cross sectional views taken along line I-I in the thickness direction for describing a manufacturing process of the mounting structure illustrated in FIG. 1.

As illustrated in FIG. 4A, a copper-clad laminate 5x formed of the substrate 7, and copper foils 17x arranged on upper and lower sides of the substrate 7 is prepared. This is performed specifically as described below.

First, a varnish containing the uncured resin 12 and the inorganic insulating particles 13 is prepared, and a resin sheet is formed by impregnating the woven fabric 11 with the varnish. When the woven fabric 11 is impregnated with the varnish, the inorganic insulating particles 13 hardly infiltrate among the glass fibers 9 of the woven fabric 11, inorganic insulating particles 13 are aggregated in a region (region to be made as the resin layer 15) outside the woven fabric 11. The uncured state is a state of A-stage or B-stage complying with ISO472:1999. Next, after the copper foils 17x are laminated on upper and lower sides of the resin sheet to thereby form a laminated body, the laminated body is heated and pressurized in a thickness direction thereof so that the resin 12 is thermally cured to form the substrate 7, and the copper-clad laminate 5x described above is formed.

When the substrate 7 is formed in this way, the woven fabric 11 of the resin sheet and the resin among the glass fibers 9 make the fiber layer 14, and adjacent regions outside the woven fabrics 11 of the resin sheet adhere to each other to make the resin layer 15.

(Formation of Through Holes)

Figure 4B:
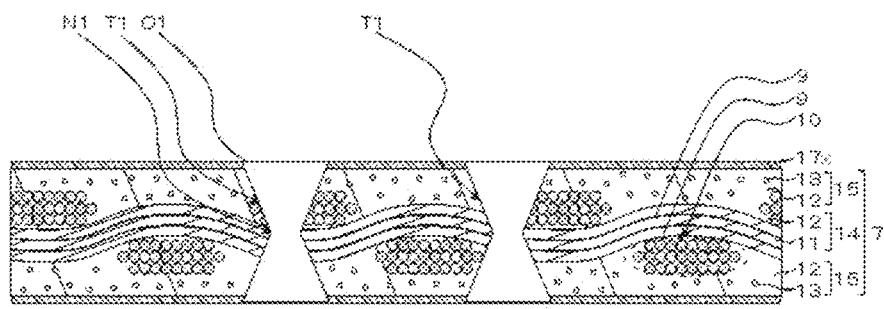

As illustrated in FIG. 4B, the through hole T is formed in the copper-clad laminate 5x using a sandblasting method. This is performed specifically in the following manner.

First, resists having openings at positions where the through hole T is formed are formed on both sides of the copper-clad laminate 5x. The resists can be formed, for example, by exposing and developing a photosensitive resin. Next, by blasting fine particles from a nozzle of a sandblasting device onto one principal surface of the copper-clad laminate 5x, one portion (non-penetrating) of the through hole T is formed through the opening of the resist. Next, by blasting the fine particles onto the other principal surface of the copper-clad laminate 5x, the through hole T that penetrates through the substrate 7 is formed. The through hole T may be formed by blasting the fine particles only onto one principal surface of the copper-clad laminate 5x. Subsequently, the resist is removed by using 1 to 3 wt % of a sodium hydroxide solution or the like. Then, by cleaning the inner wall of the through hole T by high-pressure water washing, remaining fine particles or processing residue of the through hole T are removed.

In this way, when the sandblasting method is used, the through hole T is formed by blasting of the fine particles. Accordingly, as compared with the drilling, the stress and heat applied to the border between the glass fibers 9 and the resin 12 can be reduced. Further, as compared with the laser processing, the heat to be applied to the border between the glass fibers 9 and the resin 12 can be reduced. Therefore, when the sandblasting method is used, an occurrence of the separation between the glass fibers 9 and the resin 12 can be reduced as compared with the case of the drilling or the laser processing. For this reason, it is possible to narrow a gap between the adjacent through hole conductors 8 while the occurrence of short circuiting is reduced, and eventually, it is possible to increase the wiring density of the wiring board 4.

Further, in the case where the content of the inorganic insulating particles 13 in the substrate 7 is increased, the drill does not wear in the case of drilling, and the through hole T can be formed easier than in the case of the laser processing. Accordingly, when the content of the inorganic insulating particles 13 in the substrate 7 is large, the through hole T can be formed efficiently by using the sandblasting method.

In particular, it is preferable that the content of the inorganic insulating particles 13 in the resin layer 15 be set to 40% by volume to 75% by volume as described above. By setting the content of the inorganic insulating particles 13 to 40% or more by volume, machinability of the resin layer 15 by the sandblasting method can be enhanced. By setting the content of the inorganic insulating particles 13 to 75% by volume or less, shedding of the inorganic insulating particles 13 from the inner wall of the through hole T when the through hole T is formed can be reduced. As a result, it is possible to reduce the reduction of the adhesion strength between the inner wall of the through hole T and the through hole conductor 8, which is otherwise caused by remaining bubbles in the recesses caused by the shedding.

Since the sandblasting is carried out using the resists, the plurality of through holes T can be simultaneously processed by blasting the fine particles broadly. Therefore, as compared with the drilling or the laser processing, the through hole T can be efficiently formed. Particularly, when the thickness of the substrate 7 is set to a small size of 0.03 mm to 0.4 mm, the through hole T can be efficiently formed using the sandblasting method.

As described above, to form the through hole T by the sandblasting method, the sandblasting method can be used, for example, under the following condition.

The sandblasting method is performed using dry blast. As a result, as compared with wet blast, since resistance working against fine particles is smaller, machinability of the through hole T is enhanced, and processing residue during cutting is reduced, and disturbance in cutting caused by the processing residue can be reduced.

It is preferable to use spalled particles made of an inorganic insulating material having hardness higher than that of glass as the fine particles blasted by the sandblasting. As a result, the glass fibers 9 exposed in the inner wall of the through hole T can be efficiently cut by sharp end portions of the spalled particles which are harder than the glass fibers 9. Accordingly, the through hole T can be efficiently formed while the stress applied between the glass fibers 9 and the resin 12 is reduced.

Examples of the inorganic insulating materials having the hardness larger than the hardness of the glass include alumina, silicon carbide, zirconia, or the like. It is preferable to use alumina among them. As the hardness, Vickers hardness can be used.

It is preferable that the particle diameter of the fine particles is set to 10 μm to 30 μm. By setting the particle diameter at 10 μm or larger, machinability by the fine particles can be enhanced, and the through hole T can be easily formed. By setting the particle diameter at 30 μm or smaller, the fine particles are not blocked in the hole, and the through hole T can be formed. The particle diameter refers to an average value of maximum diameters of individual particles.

It is preferable that a pressure for blasting the fine particles be set to 0.1 MPa to 0.22 MPa. By setting the pressure to 0.1

MPa or higher, the glass fibers 9 in the through hole T can be efficiently cut. By setting the pressure to 0.22 MPa or lower, it is possible to perform processing so that the spalled particles collide with one another, and the resin 12 in the inner wall of the through hole T is not excessively cut.

It is preferable that a blasting quantity be set to 30 g/min to 200 g/min.

The number of times to blast the fine particles to one through hole (the number of scans) is set in accordance with the thickness of the substrate 7. For example, this is set to 4 times to 20 times in the case where the thickness of the core substrate 5 is 80 µm to 400 µm.

A desmearing process may not be applied to the inner wall of the through hole T that is formed by the sandblasting method. As compared with the drilling or the laser processing, when the through hole T is formed by the sandblasting method, heat that is applied to the inner wall of the through hole T is reduced, and therefore residue of carbonized resin can be reduced. In addition, since intermolecular bond is physically broken, the reaction activity of the surface of the resin 12 exposed on the inner wall of the through hole T can be enhanced.

Accordingly, an adhesion strength between the inner wall of the through hole T and the through hole conductor 8 can be increased without performing the desmearing process. In this way, absence of the desmearing process reduces occurrences in which only the resin 12 is selectively etched, and a side surface of the glass fiber 9 is largely exposed. Accordingly, an occurrence of separation between the resin 12 and the glass fiber 9 can be reduced.

In the sandblasting method described above, the etching rate (cut rate per unit time) of the glass fiber 9 is smaller as compared with the etching rate of the resin 12. Accordingly, when the sandblasting method is performed, in a high-density region where the number of the glass fibers 9 is large in a thickness direction of the woven fabric 11, the first through hole T1 with the first narrow width portion N1 having a smaller width is formed, and, in a low-density region where the number of the glass fibers 9 is smaller in the thickness direction of the woven fabric 11, the second through hole T2 with the second narrow width portion N2 having a larger width is formed.

In this way, for forming the first through hole T1 and the second through hole T2, it is preferable to use the sandblasting method under the following condition.

First, the pressure for blasting the fine particles is preferably set to 0.1 MPa to 0.15 MPa. By reducing the blasting pressure in this way, the etching rate of the glass fiber 9 is reduced, and a difference between the width of the first narrow width portion N1 and the width of the second narrow width portion N2 can be made larger.

It is preferable that the particle diameter of the fine particles be 1/3 or less of the opening diameter of the through hole T. By reducing the particle diameter in this way, the etching rate of the glass fiber 9 is reduced, and the difference between the width of the first narrow width portion N1 and the width of the second narrow width portion N2 can be made larger.

As a result of forming the first through hole T1 and the second through hole T2 while the openings of the resist are set in an identical shape, the width of the first opening O1 of the first through hole T1 and the width of the second opening O2 of the second through hole T2 can made identical with each other.

(Formation of Through Hole Conductor)

Figure 5A:
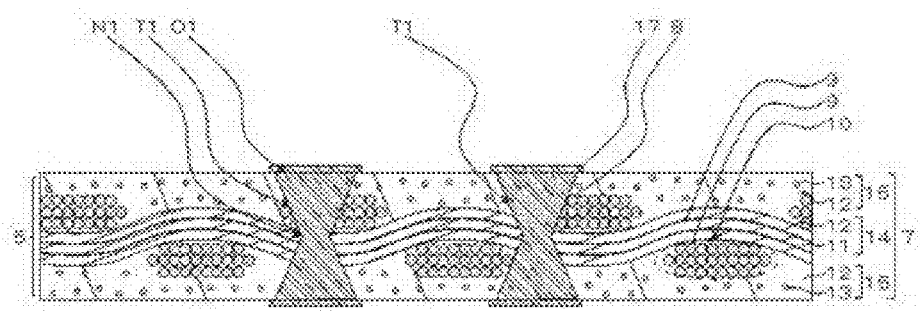
FIGS. 5A and 5B are cross sectional views taken along line I-I in the thickness direction for describing a manufacturing process of the mounting structure illustrated in FIG. 1.

As illustrated in FIG. 5A, the through hole conductor 8 and the conductive layer 17 are formed in the substrate 7 to thereby produce the core substrate 5. This is performed specifically in the following manner.

First, the copper foils 17x are removed by the conventionally well-known etching. Next, a conductive material is adhered onto the inner wall of the through hole T by, for example, the semi-additive method using the non-electroplating method and the electroplating method. Further, the conductive material is filled into the through hole T to thereby form the through hole conductor 8, and the conductive material is adhered onto the two principal surfaces of the substrate 7 to thereby form the conductive layer 17. For adhering the conductive material, the vapor deposition method, the CVD method, or sputtering method may be used other than the non-electroplating method and the electroplating method. In addition, the subtractive method or the full-additive method may be used other than the semi-additive method.

In this way, the core substrate 5 can be produced.

(Formation of Wiring Layer)

Figure 5B:
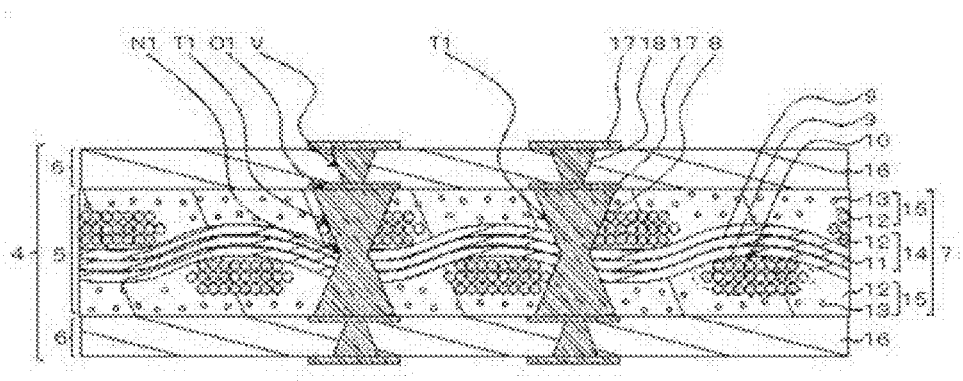

As illustrated in FIG. 5B, by forming the pair of wiring layers 6 on both sides of the core substrate 5, the wiring board 4 is produced. This is performed specifically in the following manner.

First, an uncured resin is placed on the conductive layer 17, and the resin is heated so as to adhere thereto in a fluid state, and further heated to be cured, so that the insulating layer 16 is formed on the conductive layer 17. Next, the via hole V is formed by the laser processing, and at least part of the conductive layer 17 is exposed in the via hole V. In this way, by forming the via hole V by the laser processing, damage to the conductive layer 17 which is exposed in the via hole V can be reduced as compared with the sandblasting method. Subsequently, for example, by the semi-additive method, the subtractive method, the full-additive method, or the like, the via conductor 18 is formed in the via hole V, and the conductive layer 17 is formed on an upper surface of the insulating layer 16.

In this way, the wiring board 4 can be produced. By repeating these processes, the insulating layer 16 and the conductive layer 17 may be multilayered in the wiring layer 6.

(Mounting of Electronic Component)

The bumps 3 are formed on an upper surface of the conductive layer 17 which is the uppermost layer, and the electronic component 2 is mounted by flip chip bonding on the wiring board 4 through the bumps 3.

In this way, the mounting structure 1 illustrated in FIGS. 1 to 3 can be produced.

The present invention is not limited to the embodiment described above, and various modifications, improvements, combinations, and the like may be made without departing from the spirits and scope of the present invention.

In the embodiment described above, although an example of a configuration using the semiconductor device as the electronic component is described, a capacitor or the like may be used as the electronic component.

In the embodiment described above, although an example of a configuration in which the electronic component is mounted on the wiring board by the flip chip bonding is described, the electronic component may be mounted on the wiring board by the wire bonding, or mounted on the inside of the wiring board.

In the embodiment described above, although an example of a configuration in which the wiring layer includes one layer of the insulating layer is described, the wiring layer may include any number of the insulating layers.

In the embodiment described above, although an example of a configuration in which the substrate includes one layer of the woven fabric, the substrate may include any number of layers of the woven fabric.

In the embodiment described above, although an example of a configuration in which the first resin of the fiber layer and the second resin of the resin layer are identical, the first resin of the fiber layer and the second resin of the resin layer may be different from each other.

In the embodiment described above, although an example of a configuration in which the through hole conductor is filled in the through hole, the through hole conductor may be adhered onto the inner wall of the through hole. For example, the through hole conductor may be adhered onto the inner wall of the through hole and also may be formed in a cylindrical shape. In such a case, a region surrounded by the through hole conductors having a cylindrical shape is filled with an insulating member made of a resin such as epoxy resin.

In the embodiment described above, although an example of a configuration in which the copper foil is used in the process of Preparation of Substrate, a metallic foil made of a metallic material such as a nickel-iron alloy or an iron-nickel-cobalt alloy may be used instead of the copper foil.

Examples

Hereinafter, while the present invention is described in detail with reference to examples, the present invention is not limited to the following examples, and a modification and an embodiment without departing from the spirits and scope of the present invention may be included in the present invention.

(Evaluation Method)

The copper foils are respectively laminated on the two sides of the substrate to produce the copper-clad laminate, and the through hole is formed by the sandblasting method. Next, after the copper foils are removed by an etchant, the through hole conductor is formed on the inner wall of the through hole using the non-electroplating method and the electroplating method, and the core substrate is formed. Thereafter, the core substrate is cut in the thickness direction thereof individually at the high-density region and the low-density region of the woven fabric, and the cut surface is observed using a metallographical microscope.

(Preparation Condition of Copper-Clad Laminate)

First, a resin sheet containing uncured epoxy resin (resin), silica filler (inorganic insulating particles), and glass cloth (woven fabric) is prepared. The resin sheet contains 60% by volume of the silica filler. Next, the copper foils are laminated respectively on the two sides of the resin sheet to form a laminated body. Then, the laminated body is subjected to heating and pressurizing (220° C. and 3 MPa) in a thickness direction thereof for 90 minutes, to thereby produce the copper-clad laminate described above.

(Processing Conditions of Through Hole)

The sandblasting method is performed under the following conditions.

Blasting quantity of the fine particles: 50 g/min
Pressure for blasting the fine particles: 0.15 MPa
Shape of the fine particles: spalled particles
Particle diameter of the fine particles: #800 (26 μm)
Material of the fine particles: alumina (Result)

Figure 6A:
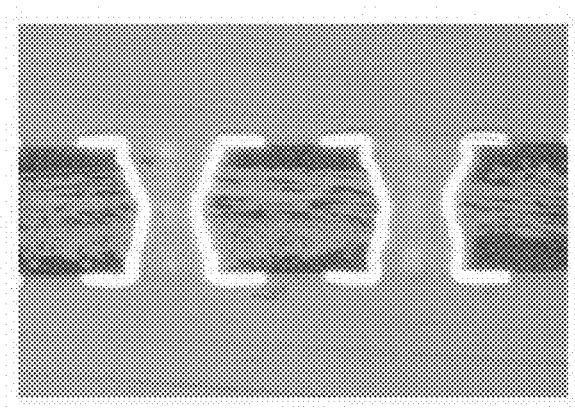
FIG. 6A is a photograph of a cross section obtained by cutting a core substrate at a high-density region of the woven fabric in a thickness direction thereof and photographing the cross section using a metallographical microscope.
Figure 6B:
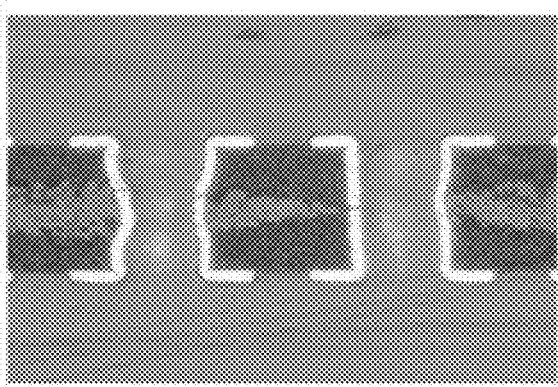
FIG. 6B is a photograph of a cross section obtained by cutting a core substrate at a low-density region of the woven fabric in a thickness direction thereof and photographing the cross section using a metallographical microscope.

As illustrated in FIG. 6A, the width of the first narrow width portion is smaller in the first through hole that penetrates through the larger number of the glass fibers. In contrast, as illustrated in FIG. 6B, the width of the second narrow width portion is larger in the second through hole that penetrates through the smaller number of glass fibers.

What is claimed is:

1. A wiring board comprising:
a substrate including a woven fabric formed of a plurality of glass fibers and a resin covering the woven fabric;
a plurality of through holes penetrating through the substrate in a thickness direction thereof; and
a plurality of through hole conductors adhered to inner walls of the through holes respectively,
wherein the through holes comprise a first through hole and a second through hole,
in the woven fabric, the number of the glass fibers through which the first through hole penetrates is larger than the number of the glass fibers through which the second through hole penetrates,
in the first through hole and the second through hole, narrow width portions thereof having narrowest widths, respectively, are surrounded by the woven fabric, and
the narrow width portion of the first through hole is smaller than the narrow width portion of the second through hole.

2. The wiring board according to claim 1,
wherein the first through hole and the second through hole have a shape of which the width becomes smaller from each of two principal surfaces of the substrate toward a center of the substrate.

3. The wiring board according to claim 1,
wherein the width of an opening of the first through hole in one of the principal surfaces of the substrate is set to 0.9 times or more and 1.1 times or less the width of an opening of the second through hole in the one of the principal surfaces of the substrate.

4. The wiring board according to claim 3,
wherein the width of the opening of the first through hole in the one of the principal surfaces of the substrate is identical with the width of the opening of the second through hole in the one of the principal surfaces of the substrate.

5. The wiring board according to claim 1,
wherein a minimum width of the first through hole in a region surrounded by the woven fabric is set to 0.5 times or more and less than 0.9 times a minimum width of the second through hole in a region surrounded by the woven fabric.

6. The wiring board according to claim 1,
wherein the woven fabric is formed by weaving, lengthwise and widthwise, fiber bundles formed of a plurality of glass fibers, and
the widths of the narrow width portions of the first through hole and the second through hole are smaller than the width of the fiber bundle.

7. The wiring board according to claim 1,
wherein a wiring layer is formed on one surface of the substrate, or wiring layers are respectively formed on two surfaces of the substrate, and
the wiring layer includes:
an insulating layer in which a via hole penetrating through the wiring layer in a thickness direction thereof is formed;
a conductive layer formed on each of a surface of the substrate or a surface of the insulating layer; and
a via conductor formed in the via hole and electrically connected to the conductive layer.

8. A mounting structure comprising:
the wiring board according to claim 1; and
an electronic component electrically connected to the through hole conductors.

* * * * *